(12) United States Patent
Funada et al.

(10) Patent No.: US 6,214,446 B1
(45) Date of Patent: Apr. 10, 2001

(54) RESIN FILM AND A METHOD FOR CONNECTING ELECTRONIC PARTS BY THE USE THEREOF

(75) Inventors: Yoshitsugu Funada; Rieka Ohuchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/258,794

(22) Filed: Mar. 1, 1999

(30) Foreign Application Priority Data

Mar. 3, 1998 (JP) .................................................. 10-050630

(51) Int. Cl.[7] ........................................................ B32B 7/02
(52) U.S. Cl. ............................ 428/212; 428/500; 428/331
(58) Field of Search ..................................... 428/195, 206, 428/212, 323, 331, 500

(56) References Cited

U.S. PATENT DOCUMENTS 5,874,780 * 2/1999 Murakami ............................. 257/775

FOREIGN PATENT DOCUMENTS

| | | |
|---|---|---|
| 62-141083 | 6/1987 | (JP) . |
| 2-7180 | 1/1990 | (JP) . |
| 7-157720 | 6/1995 | (JP) . |
| 9-97816 | 4/1997 | (JP) . |
| 10-158526 | * 6/1998 | (JP) . |
| 11-055066 | * 2/1999 | (JP) . |
| 11-203938 | * 7/1999 | (JP) . |

* cited by examiner

Primary Examiner—Bruce H. Hess
Assistant Examiner—B. Shewareged
(74) Attorney, Agent, or Firm—McGuireWoods LLP

(57) ABSTRACT

This invention provides a resin film preferably used for mounting a semiconductor chip on a substrate through flip-chip connection, and a method based on the use of such a resin film. The resin film has a laminated B/A/B structure where a first resin layer (A) having inorganic particles dispersed in an insulating resin is sandwiched by second and third resin layers (B) having no inorganic particles in their insulating resins. The method for connecting electronic parts comprises the steps of forming metal projections (bumps) on a plurality of connection terminals prepared on the surface of a first electronic part; preliminarily pressing the resin film against a plurality of connection terminal surfaces of the other electronic part; applying pressure onto the connection parts in the presence of heat after having properly aligned the metal projections of the first electronic part with the corresponding connection terminals of the other electronic part, thereby establishing electric connection and at the same time mechanical contact between the two electronic parts through the resin film melt and solidifying.

13 Claims, 10 Drawing Sheets

| | SHAPE OF METAL PROJECTION | CONNECTING CONDITION | INITIAL RESISTANCE(Ω) | RECIABILITY 1 | RECIABILITY 2 |
|---|---|---|---|---|---|
| EXAMPLE 1 | POINTED | 200°C 15sec | 0.03 | GOOD | GOOD |
| 2 | POINTED | 190°C 20sec | 0.06 | GOOD | GOOD |
| 3 | POINTED | 200°C 15sec | 0.02 | GOOD | GOOD |
| 4 | POINTED | 220°C 30sec | 0.1 | GOOD | GOOD |
| 5 | POINTED | 230°C 30sec | 0.15 | GOOD | GOOD |
| 6 | POINTED | 140°C 10sec → 190°C 10sec | 0.1 | GOOD | GOOD |
| 7 | POINTED | 200°C 15sec | 0.1 | GOOD | GOOD |
| 8 | FLATTED | 210°C 15sec | 0.1 | GOOD | GOOD |
| 9 | FLATTED | 200°C 20sec | 0.08 | GOOD | GOOD |
| 10 | FLATTED | 210°C 20sec | 0.05 | GOOD | GOOD |

FIG.14

| | SHAPE OF METAL PROJECTION | CONNECTING CONDITION | INITIAL RESISTANCE(Ω) | RECIABILITY 1 | RECIABILITY 2 |
|---|---|---|---|---|---|
| EXAMPLE 1 | FLATTED | 180°C 20sec | 0.1 | GOOD | GOOD |
| COMPARATIVE EXAMPLE 1 | POINTED | 200°C 15sec | 0.02 | GOOD | POOR |
| 2 | POINTED | 200°C 15sec | 5 | POOR | POOR |
| 3 | POINTED | 200°C 15sec | 0.05 | GOOD | POOR |
| 4 | FLATTED | 210°C 20sec | 0.1 | POOR | POOR |
| 5 | FLATTED | 200°C 20sec | 10 | POOR | POOR |

FIG.15

RESIN FILM AND A METHOD FOR CONNECTING ELECTRONIC PARTS BY THE USE THEREOF

BACKGROUND OF THE INVENTION

1. Field of the Invention

The present invention relates to a resin film to be used for connecting electronic parts, and a method for connecting electronic parts based on the use thereof, more particularly to a resin film suitable for electrically and mechanically connecting an electronic part such as a semiconductor chip and another electronic part such as a substrate, and a method based on the use thereof.

2. Description of the Prior Art

In recent years, with the development of small and thin electronic parts, a demand has been rising for the connection of a minute part such as a semiconductor chip with a substrate carrying a microcircuit pattern, and with such tendency, the interval between adjacent wires becomes increasingly short.

Conventionally, for such purpose, a method has been principally employed whereby a wire is bonded between the connection terminals of parts to be connected. However, an alternative method whereby parts to be connected are allowed to face to each other and then bonded directly together is more suitable than the conventional bonding method for the quicker production of small and thin parts, and thus the latter method, or the flip-chip connection is more avidly employed nowadays. The connection joints of parts joined by this method are mainly sealed by a cheap resin for the protection of the joints from the environmental adverse effects and for the insurance of stable connection operation of the joints. For the sealing, a method has been employed whereby terminals are allowed to face to each other, they are connected electrically and then a liquid resin is poured into the gap between the terminals. Connection of connection terminals is achieved by soldering, pressure contact of gold-to-gold terminals, and bonding with an electroconductive paste.

However, with the development of smaller and thinner parts, the gap between a substrate and the part placed opposite thereto, and the distance between adjacent terminals of part become smaller, which makes difficult the pouring of a liquid resin (so-called under-fill) into or through those gaps and intervals. Generally, a thermosetting resin with a low viscosity such as an epoxy resin is used.

Another alternative method has been proposed (Japanese Patent Laid-Open Publication No. 2-7180) whereby a liquid resin is applied in advance onto a part of a substrate which will carry a chip before the substrate and chip are assembled; the terminals to be connected are placed opposite properly to each other; they are pressed together while being heated; and thus electrical as well as mechanical connection is established between the two terminals (dispensing with the use of an under-fill). With this method, the semiconductor chip and the substrate are connected to each other electrically because their terminals come into direct contact to each other owing to a contraction force accompanying the hardening of thermosetting resin. Generally, when an electronic part is used in a high-temperature environment, or a semiconductor element generating a high temperature such as a power module is incorporated in a semiconductor chip, resin around that semiconductor chip expands in the presence of heat, and contracts after use as the high temperature subsides. Repeating this process will lead to the deterioration of the resin in question.

With the above method, electric connection of terminals is maintained only by the contraction force of resin generated after hardening which is applied around the terminals in question. Therefore, with the deterioration of resin after repeated expansions and contractions, the contraction force thereof becomes slackened, and as a result of this, when the thermal expansion in the presence of heat exceeds the contraction after withdrawal of heat, failure of electrical connection results. To prevent this, it is necessary to reduce the thermal expansion coefficient of the resin to maintain the thermal expansion thereof at a low level. For this purpose, as shown in FIG. 1, for electrical connection of a semiconductor chip with a substrate, a resin 111 is used which contains inorganic particles 112 having a smaller thermal expansion coefficient such as silica particles.

In this case, when the connection terminal of a semiconductor chip has a tip having essentially a flat surface, a liquid resin may creep between the opposing terminals of semiconductor chip and substrate, which may lead to failed electric connection between them. Particularly, inorganic particles such as silica particles contained in the resin easily creep between such opposing terminals. As a preventive measure for this, a method has been proposed (Japanese Patent Laid-Open Publication No. 9-97816) whereby a pointed metal projection (bump) is prepared on the connection terminal of a semiconductor chip.

Or a further alternative method or the connection method based on the use of an anisotropic resin has been proposed (Japanese Patent Laid-Open Publications Nos. 62-141083 and 7-157720) whereby, as shown in FIG. 2, conductive particles 122 are allowed to uniformly disperse in a resin 121 interposed between a semiconductor chip and a substrate, and thus to exist between the opposing terminals, and then the terminals are pressed together while being heated thereby establishing electric connection of those terminals as well as ensuring insulation from adjacent terminals. In this method, for conductive particles 122, for example, metal particles made of nickel or a soldering alloy, or resin particles whose insulating surfaces are plated with gold are used. To prepare such resin particles, a resin in the form of a liquid (or paste) or a film is used. In this method, terminals to be connected should preferably have a flat surface because then conductive particles are more effectively maintained between the opposing connecting terminals.

As discussed above, when a liquid (paste) resin having a thermosetting property is used as a resin for flip-chip connection, the resin requires a long time lasting several minutes to several hours before it hardens, which will lead to the lowering of productivity.

Alternatively, as shown in FIG. 3, when the connection terminal 136 of a semiconductor chip 135 is allowed to have a bump 139 thereupon, and is pressed against a substrate 137 while being heated, the resin 131, particularly small-sized inorganic particles 133 contained therein, when they have a broad distribution in particle size, may be trapped in the space between the connection terminal 138 of substrate 137 and the bump 139, which may cause troubles leading to incomplete electric connection of involved terminals.

A resin with a low stress developing property has been favorably employed regardless of whether it is used in connection with conductive particles or not, because such a resin improves the reliability of terminal connection, particularly resistance of connected terminals against thermal shocks. However, when a resin contains inorganic particles, it becomes hard, and thus its affinity at interfaces to the electronic part tends to fall. When an anisotropic, conductive resin is used, usually it is never provided, or provided only with a comparatively small amount of inorganic particles. Therefore, such a resin will have a rather high thermal expansion coefficient, and thus its resistance to heat stresses and moisture may be insufficient.

A first object of this invention is to provide a resin film which, when used for the seal of connection between a semiconductor chip and a substrate, is highly affinitive to the chip and substrate at interfaces, and will give less adverse effects to the connection terminals even under thermal stresses after setting, and a method based on the use of such a resin film for the electric connection of electronic parts.

A second object of this invention is to provide a resin film which, being suitably used for the seal of connection achieved by the flip-chip method, can seal such a connection in a short time, and ensure high reliability of the connection, and a method based on the use of such a resin film for the electric connection of electronic parts.

A third object of this invention is to provide a resin film made of a resin containing inorganic particles which, even when the particles are trapped in the space between a semiconductor chip and a substrate, is so prepared that the reliability of connection may not be impaired, and a method based on the use of such a resin film for the electric connection of electronic parts.

SUMMARY OF THE INVENTION

The resin film of this invention is used for the flip-chip connection of a semiconductor chip (first electronic part) and a substrate (second electronic part), and composed of a first resin layer (A) of an insulating resin sandwiched by second and third resin layers (B) both made of an insulating resin, or has a B/A/B laminated structure, the elastic modulus of second and third resin layers (B) being less than that of first resin layer (A).

Through this feature, following advantages are ensured:

(1) The affinity of resin at interfaces to the semiconductor chip (first electronic part) and to the substrate is excellent; and (2) Because the elastic modulus of second and third resin layers (B) is smaller than that of first resin layer (A), the resulting resin film will give less adverse effects on the connection terminals of semiconductor chip and substrate even after they have been exposed to thermal stresses after hardening.

With this invention, the first resin layer (A) has insulating inorganic particles dispersed within in order to reduce the elastic thermal expansion coefficient. The second and third resin layers (B) do not contain any inorganic particles. Through this arrangement it becomes possible, in addition to ensure the first and second advantages cited above, to reduce the expansion in the direction of thickness in the presence of heat applied after hardening because the thermal expansion coefficient of first resin layer (A) is reduced owing to the existence of insulating inorganic particles therein, and to prevent deterioration of the resins after repeated contractions and to avoid incomplete electric connections after repeated expansions.

Generally, a single layer made of a resin containing insulating inorganic particles tends to develop a larger internal stress because it becomes harder, and thus the affinity thereof to a semiconductor chip and to a substrate is reduced. However, with this invention, because second and third resin layers (B) are formed on the top and bottom surfaces of a resin layer containing insulating inorganic particles, the internal stresses of the latter developing adjacent to a semiconductor chip and a substrate are reduced, and the affinity thereof to the chip and substrate is improved.

In a further aspect the resin film of this invention has a laminated structure of B/A/B layers which are further supplemented with conductive particles having a different diameter from that of insulating inorganic particles, in addition to the insulating inorganic particles. In this case, the conductive particles may be preferably added to at least one of the second and third resin layers. Addition of conductive particles allows the conductive particles to be trapped between the connection terminals when a semiconductor chip and a substrate is pressed to each other for connection, to enhance the connection reliability.

In a still further aspect, the resin film may preferably have conductive particles having a different diameter from that of insulating inorganic particles added, besides the insulating inorganic particles. In this case, the diameter of conductive particles should be determined appropriately with respect to that of insulating inorganic particles depending on whether the projection prepared on the surface of connection terminals of a semiconductor chip is pointed or flattened. Through this feature it becomes possible to maintain the reliability of connections even when a resin film incorporating insulating inorganic particles is used for the electric connection of a semiconductor chip and a substrate, and even when such insulating particles are trapped in the space between the chip and the substrate.

In a still further aspect, this invention provides a method for connecting electronic parts comprising the steps of:

forming metal projections (for example bumps) on the plural connection terminals of a first electronic part;

attaching preliminarily a resin film having a B/A/B laminated structure in which a first resin layer (A) made of an insulating resin is sandwiched between second and third resin layers (B) both made of insulating resins, to the surface of plural connection terminals prepared on a second electronic part by pressure; and properly aligning the metal projections of terminals of first electronic part with the corresponding terminals of second electronic part, establishing electric connection of the two partss by pressure in the presence of heat, and achieving at the same time mechanical connection of the two partss while the resin film is kept melted. With this resin film, the elastic modulus of second and third resin layers (B) is smaller than that of first resin layer (A).

According to this invention, insulating inorganic particles such as silica particles are added as a component of the first resin layer (A) which is then made into a film. The film can harden in a short time, has a rather low thermal expansion coefficient, and has an improved resistance against mechanical impacts, thermal stresses and moisture. With this film, however, the single layer containing insulating inorganic particles comes to have larger internal stresses because of its becoming harder, and its affinity to a semiconductor and to a substrate is impaired. To moderate this defect, resin layers having no inorganic particles are applied on both sides of the single layer in question containing inorganic particles, which reduces internal stresses developed adjacent to the semiconductor chip and substrate, and improves the affinity of the film to the latter.

BRIEF DESCRIPTION OF THE DRAWINGS

FIG. 14 gives diagrams to illustrate an example for explaining how an electronic part and a substrate are electrically connected through a resin film of this invention.

FIG. 15 gives diagrams to illustrate an example and a comparative example for explaining how an electronic part and a substrate are electrically connected through a resin film of this invention.

DETAILED DESCRIPTION OF THE PREFERRED EMBODIMENTS

Next, the preferred embodiments of this invention will be described in detail with reference to accompanying figures.

Firstly, a resin film representing an embodiment of this invention will be given. The resin (base resin) to be used as the base of a resin film of this invention may include thermosetting resins and thermoplastic resins, but are not limited to them.

The preferred thermosetting resin may include, for example, epoxy resins, phenol resins, silicone resins, etc. The epoxy resin may include bis-phenol A type, dicyclopentadiene type, cresolnovolak type, biphenyl type, naphthalene type, etc. The phenol resin may include resol type and novolak type. Further, the silicone resin may include resins expressed as $(R_2SiO)_n$ (in which R represents a methyl or phenyl group) in the structural formula. Furthermore, the thermoplastic resin may include acryl resins, polyester resins, ABS resins, polycarbonate resins, phenoxy resins, etc.

Figure 1:
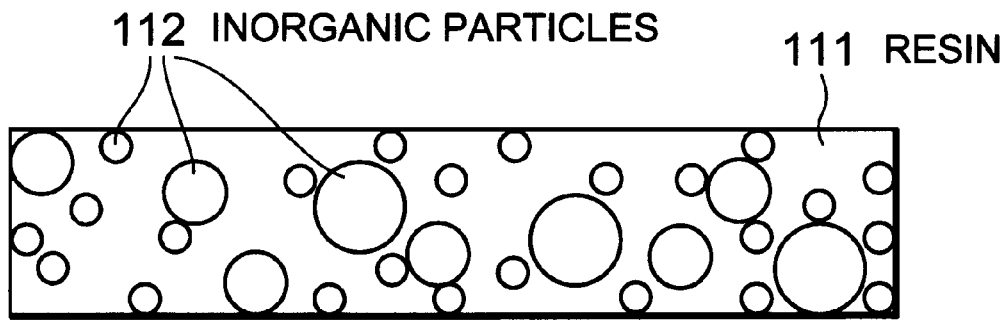
FIG. 1 is the cross-section of an example representing a conventional resin which is prepared for the electric connection of electronic parts through flip-chip connection.
Figure 2:
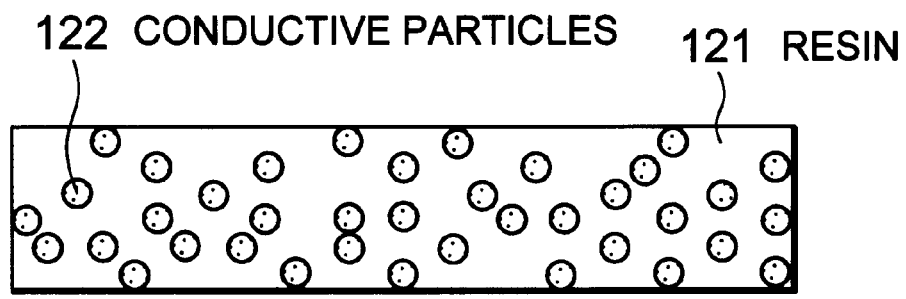
FIG. 2 is the cross-section of an example representing a conventional anisotropic, conductive resin which is prepared for the electric connection of electronic parts through flip-chip connection.
Figure 3:
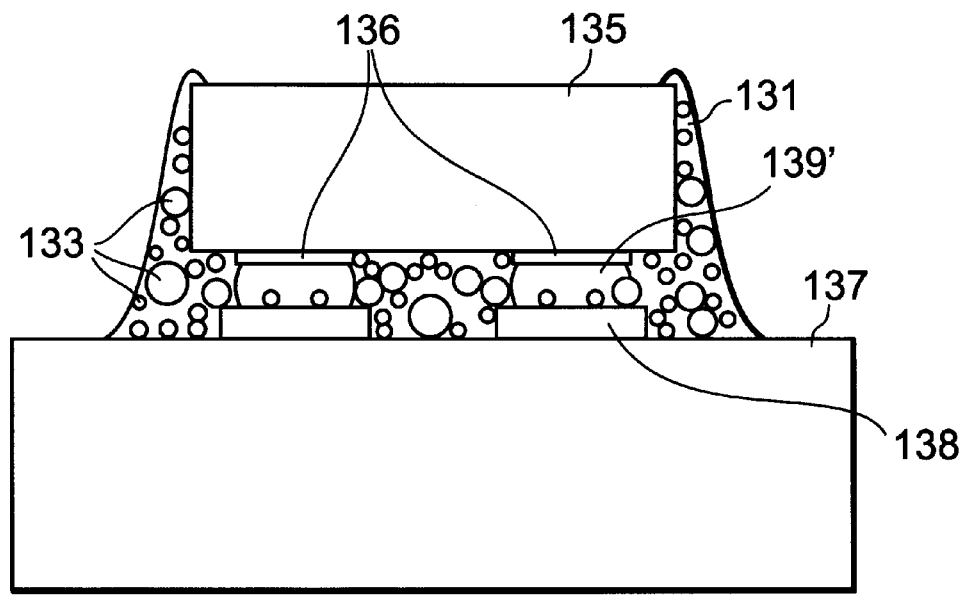
FIG. 3 is the cross-section of a defectively connected structure of an electronic part and a circuit-carrying substrate achieved by the use of a conventional resin.
Figure 4:
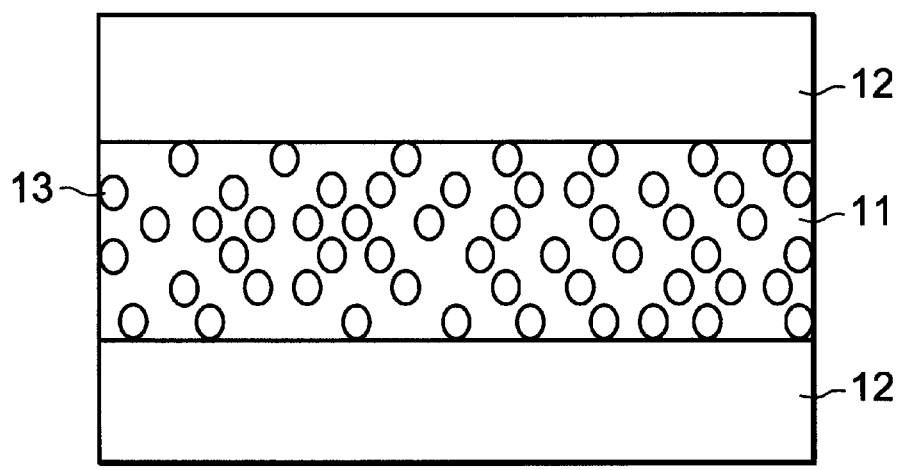
FIG. 4 is the cross-section of a resin film representing a first embodiment of this invention.

FIG. 4 is the cross-section of a resin film representing a first embodiment of this invention. The resin film shown in FIG. 4 has a B/A/B laminated structure comprising a resin layer 11 (first resin layer A), being obtained after insulating inorganic particles 13 have been mixed with an insulating resin (base resin) to disperse therein, and the resulting resin layer been inserted between two insulating resin layers 12 (second and third resin layers B) which do not contain any insulating inorganic particles.

The resin film shown in FIG. 4 is used when first and second electronic parts are connected by bonding through flip-chip connection. When a semiconductor chip and a substrate are connected through a resin film as depicted in FIG. 4, the upper resin layer faces the semiconductor while the lower layer faces the substrate. This positional relationship will commonly apply to the resins as depicted in FIGS. 5 to 9 which will be described below.

In FIG. 4, the resin layer 12 has a smaller elastic modulus than does the resin layer 11 because the latter contains insulating inorganic particles 13. Because of this, the affinity of resin layer 12 to the semiconductor chip (first electronic part) and to the substrate at interfaces is improved. Further, because the flanking resin layers 12 have a lower elastic modulus than does the central resin layer 11, the resulting film will give less adverse effects on the connection terminals of electronic parts involved than otherwise the case, even when it is subject to thermal stresses after hardening.

The resin layer 11 constituting layer A should preferably have a lower melt viscosity than does the two resin layers 12 constituting layers B. The resin film is interposed between electronic parts, and pressed while being heated. If the resin layer 11 had a higher melt viscosity than does the resin layer 12, during thermal pressurization, resin having a lower melt viscosity (resin layers 12) adjacent to the electronic parts would flow more readily, and insulating inorganic particles 13 contained in the resin layer 11 would accumulate close to the interfaces of the electronic parts, which would practically cancel the affinity improving effect of resin layers 12.

From above, it is needless to say that the resin layer containing insulating inorganic particles 13 should most preferably have a lower melt viscosity than do the resin layers 12 placed above and below it. For this purpose, a preferred combination of resin layers is represented by a film where a base resin constituting the resin layer 11 or layer A has a low melt viscosity than does another base resin constituting the resin layer 12 or layer B. When layers A and B are made of the same material, layer B should be made of a base resin having a higher molecular weight than does the base resin for layer A, because then layer A will have a lower melt viscosity than does layer B. Or alternatively as shown by a second embodiment of a resin film of this invention in FIG. 5, insulating organic particles 25 which will not affect the flexibility of resulting film may be added to resin layers 22 (layers B) placed above and below a resin layer 21 representing layer A and containing insulating inorganic particles, thereby to make layer A have a lower melt viscosity than does layer B.

Figure 5:
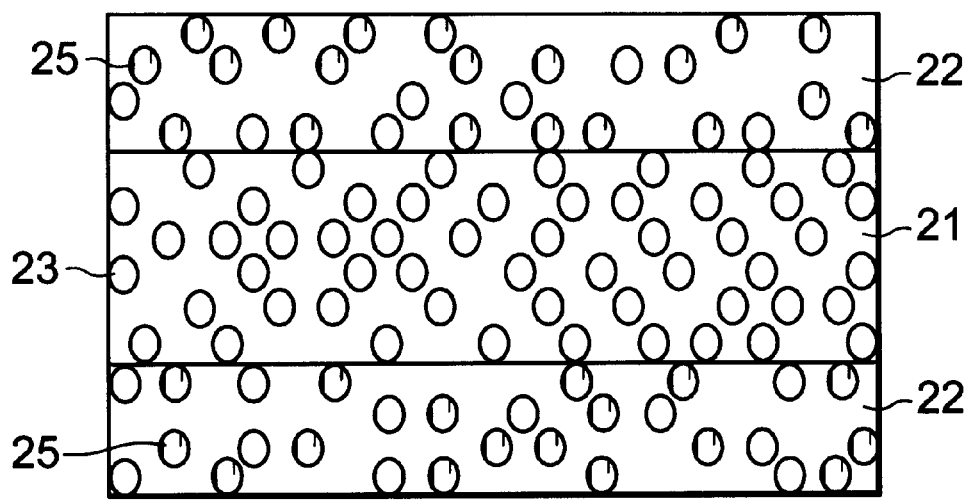
FIG. 5 is the cross-section of a resin film representing a second embodiment of this invention.

The insulating organic particles 25 of FIG. 5 may be made of an acryl resin, a polystyrene resin, etc. Further, because the thermoplastic resin generally has a higher melt viscosity than does the thermosetting resin during molding, it is possible to use a thermosetting resin for the resin layer 21 and a thermoplastic resin for the resin layer 22.

In layer A depicted in FIGS. 4 and 5, insulating inorganic particles 13 and 23 are uniformly dispersed to lower the thermal expansion coefficient of resulting resin film. The insulating inorganic particles may be made of silica, alumina, boron nitride, silicon nitride, etc., and of them spherical particles from silica are most preferred because they are produced at a low cost, have a low specific gravity, and are highly fluidic. The weight of insulating inorganic particles relative to the weight of base resin may be preferably set at 20–70 wt. %. When insulating inorganic particles 13 or 23 are added, the resin layer 11 or 21, that is, layer A will have a lowered thermal expansion coefficient. Thus, expansion of the resin in the presence of heat added after hardening is reduced, and deterioration of the resin resulting from repeated contractions can be also moderated, and incomplete electric connections resulting from repeated expansions prevented.

Figure 6:
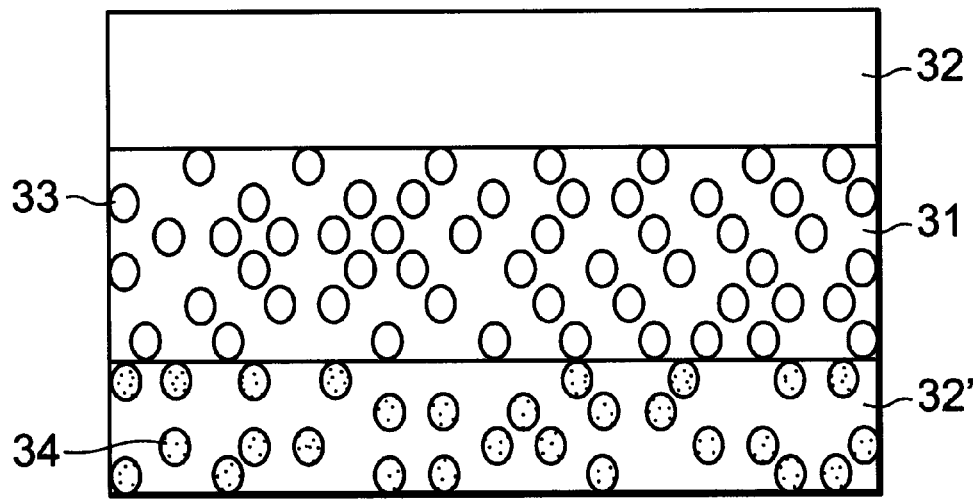
FIG. 6 is the cross-section of a resin film representing a third embodiment of this invention.
Figure 7:
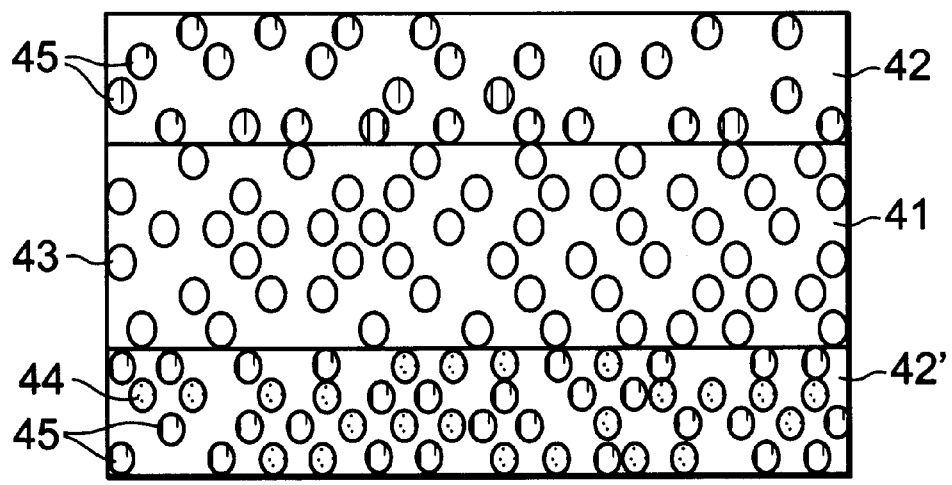
FIG. 7 is the cross-section of a resin film representing a fourth embodiment of this invention.

FIGS. 6 and 7 presents the cross-section of fourth embodiment of a resin film of this invention. To the resin layers 31 and 41 of FIGS. 6 and 7 or layers A, insulating inorganic particles 33 and 43 are added respectively. These insulating inorganic particles are made of the same material as used in the first and second embodiments. Of the resin layers 32 and 32' of FIG. 6 and the resin layers 42 and 42' of FIG. 7 or layers B, only the resin layers 32' and 42' contain conductive particles 34 and 44 respectively. In addition, both the resin layers 42 and 42' or layers B of FIG. 7 contain insulating organic particles 45, which further emphasizes the low melt viscosity of layer A over that of layer B.

Because conductive particles 34 and 44 are added to the resin layers 32' and 42' or halves of pairs of layers B shown in FIGS. 6 and 7, these films can also be used as an anisotropic conductive film. The conductive particles may be the same as those that are added to conventional anisotropic conductive films. For example, they may include metal particles of nickel, a soldering alloy, copper, silver, etc., particles of an insulating resin plated with nickel or gold, and insulating inorganic particles coated with a resin as appropriate and further plated with nickel or gold, to mention a few.

When the conductive particles 34 and 44 are insulating inorganic particles having a metal layer on their surface, they are effective in reducing the thermal expansion coefficient of resulting film, as is expected from their addition to the film. During preparation of such insulating inorganic particles, a resin coat may be intervened between the insulating inorganic particle and metal plate as appropriate, thereby to improve the affinity of inorganic particle to metal plate, and then the surface of this resin-intervened coat may be corroded with an appropriate chemical.

Above conductive particles may be added to any layers of resin films depicted in FIGS. 6 and 7. They may be added by option to all layers of a given film, but, because such option will require a high cost, the particles should be preferably added to some of layers (for example, resin layers 32' and 42'). Addition of insulating inorganic particles and conductive particles to the same layer is not preferred in this invention, because such addition will cause the resulting film to have a higher melt viscosity. Conductive particles are preferably added to one of two B layers (32' or 42' and 52' or 62'), at the blending ratio of 1 to 10 volume %.

Figure 8:
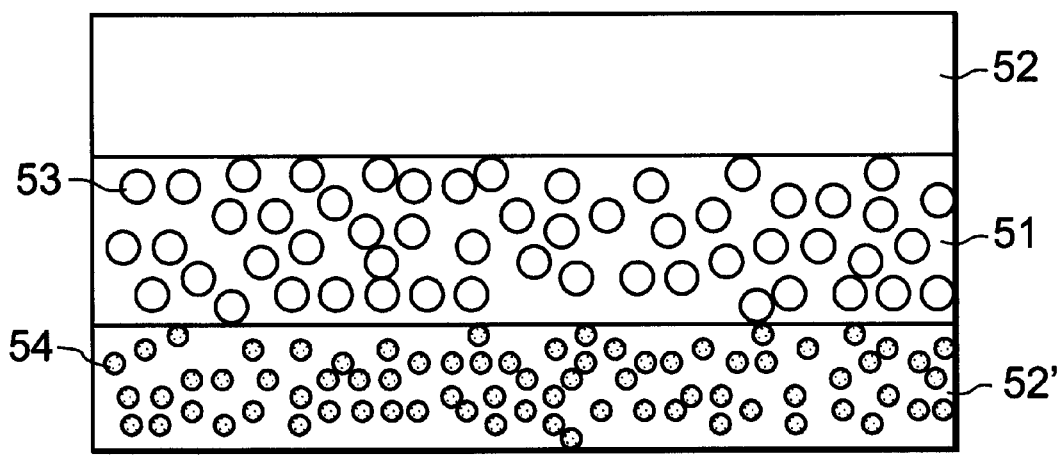
FIG. 8 is the cross-section of a resin film representing a fifth embodiment of this invention.
Figure 9:
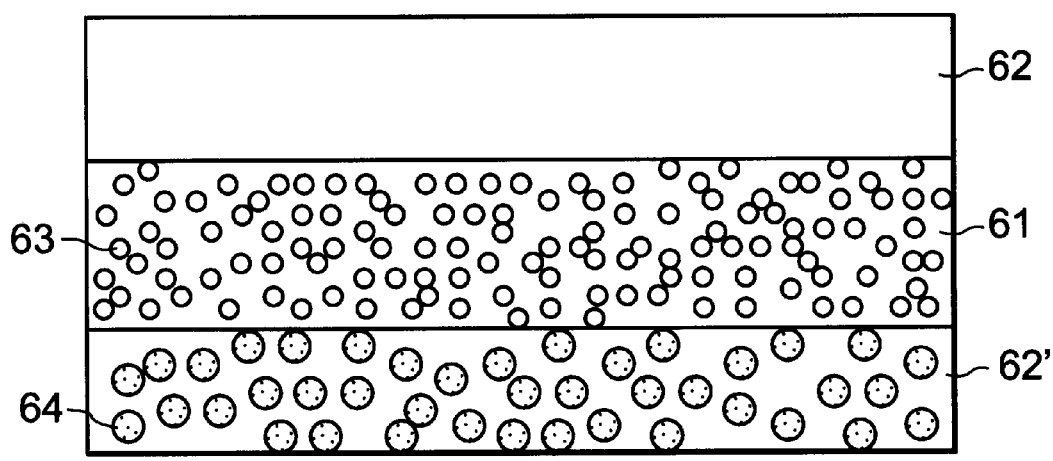
FIG. 9 is the cross-section of a resin film representing a sixth embodiment of this invention.

FIGS. 8 and 9 present the cross-section of fifth and sixth embodiments of a resin film of this invention. To the resin layers 51 and 61 of FIGS. 8 and 9 or layers A, insulating inorganic particles 53 and 63 are added respectively. Of the resin layers 52 and 52' of FIG. 8 and the resin layers 62 and 62' of FIG. 9 or layers B, only the resin layers 52' and 62' contain conductive particles 54 and 64 respectively.

Further, as shown in FIGS. 8 and 9, when insulating inorganic particles and conductive particles are allowed to coexist in a given resin film, they should preferably have different diameters. This is, as will be described later, because then conductive particles 54 and 64 will be effectively trapped between the connection terminals of opposing electronic parts to be connected. Depending on the shape of metal projections (bumps) prepared on the connection terminal not illustrated here, the diameters of two kinds of particles should be adjusted as appropriate. It is most preferred that both the insulating inorganic particles and the conductive particles have the respective uniform diameters.

The method for producing resin films as depicted in FIGS. 4 to 9 is not limited to any specific one. For example, they may be produced by a method whereby a resin composition comprising a resin base, a stiffener, a solvent and particles, and other additives given as appropriate is extended over a film of polyethylene telephthalate having a mold lubrication activity; excess solvent is allowed to evaporate at a temperature which does not permit the occurrence of thermosetting reaction to produce a film; and then different films separately prepared are laminated. When the same film product is prepared of a thermoplastic resin, for example, resin compositions for layer A and layers B are put into a T-shaped die, and the respective melts are separately ejected, and directly laminated to produce a film with a three-layered structure. When a thermosetting resin and a thermoplastic resin are combined, films from the thermosetting resin are laid over a film from the thermoplastic resin to produce a laminated film in the manner as described above.

Next, the method for connecting electronic parts based on the use of a resin film of this invention will be described. According to the connection method of this invention, it is preferred to compose the resin film differently depending on the shape of connection terminals of electronic parts to be connected. The different types of connection include, for example, connections between two electronic parts one of which has a pointed metal projection (bump) or a flat metal projection (bump).

Figure 10A:
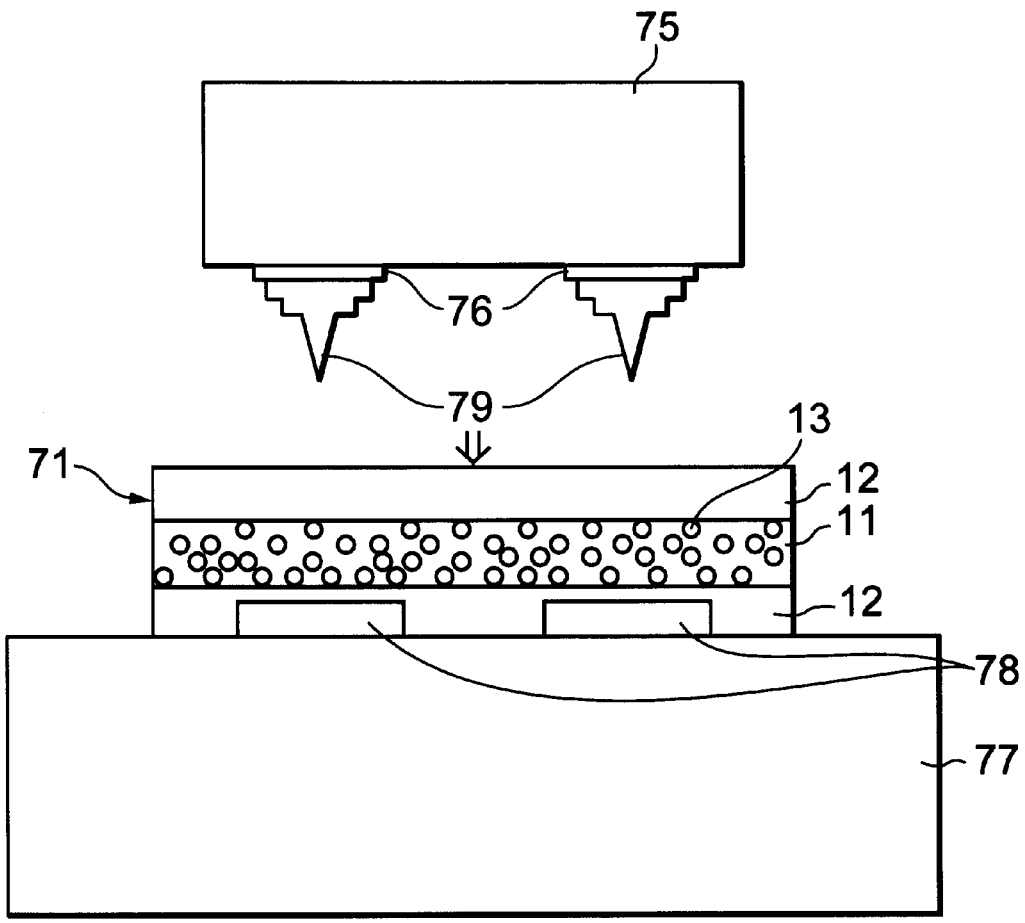
FIGS. 10A and 10B are the cross-sections of a first embodiment of this invention illustrating how an electronic part and a substrate are electrically connected through a resin film of this invention.
Figure 10B:
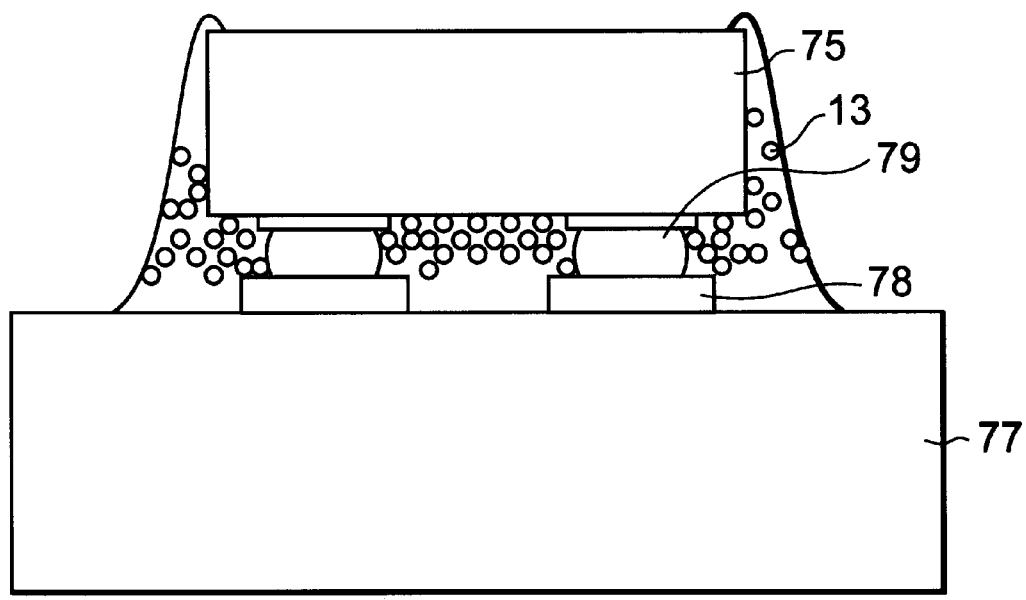

How the resin of this invention should be applied for connection of two electronic parts one of which has a pointed metal bump will be explained with reference to FIGS. 10A and 10B. FIGS. 10A and 10B illustrate, by means of an example, how a semiconductor chip 75 is connected with a substrate 77 using a resin film of this invention. In this example, the substrate 77 may be a printed wiring board made from a glass-epoxy resin, a ceramic substrate of alumina or a glass substrate. A plurality of connection terminals 76 prepared on the surface of a semiconductor chip 75 have bumps 79. The method for preparing such bumps consists, for example, of bonding a bonding wire of gold, aluminum or the like or a metal usually used for wire bonding, to the aluminum pad of a semiconductor chip and of tearing off the bond by a strong pull.

As shown in FIG. 10A, a resin film 71 is preliminarily applied by pressure onto the surface of substrate 77 at a region which is to receive a semiconductor chip. The resin film 71 has an area slightly larger than the semiconductor chip 75, and a thickness substantially equal to the sum of heights of the connection terminals 76 and 78 of semiconductor chip 75 and substrate 77, and of the bump 79.

The resin film 71 used in this example is the same as shown in FIG. 4, that is, the resin film 71 has a laminated structure: the resin layer 11 or layer A contains insulating inorganic particles 13, and flanking resin layers 12 or layers B consist only of a base resin. Further, the resin layer 12 has a higher melt viscosity than does the base film constituting the resin layer 11. The insulating inorganic particles 13 are preferably spherical particles of silica having a diameter of 3–10 μm, diameters distributing in a small range. If particles had a wide diameter range, the uniform dispersion of particles in resin would be improved, but smaller particles would more easily accumulate between the bump of a semiconductor chip 75 and the connection pad of a substrate 77.

Lastly, the opposing connection terminals of semiconductor chip 75 and substrate 77 are aligned, the semiconductor chip 75 is placed on the substrate, and the former is pressed against the latter while being heated. Through this process, the semiconductor chip 75 and the substrate 77 are connected electrically, and at the same time, the two electronic parts get physical contact with each other because of the film 71 being melted and solidified (hardened) (FIG. 10B). During this process, the pointed bump 79 of semiconductor chip 75 has its tip blunted in the presence of a pressure; the tip becomes slowly bulged; and resin over the terminal 78 of substrate 77 is rejected outward.

Because insulating particles in the resin having smaller sizes are more resistant to rejection, it is preferred to use particles whose diameter is in the range of 3 to 10 μm.

The above description applies to a resin film of which layer A contains insulating inorganic particles, and a base resin constituting layers B contains no particles. However, a film of which layers B are allowed to contain insulating organic particles 25 as shown in FIG. 5 may be used as the resin film 71.

When a connecting terminal has a pointed metal projection (bump), and is ideally joined to an opposing terminal, no base resin will be interposed between the opposing terminals, and thus no conductive particles will be needed. Actually, however, interposition of resin between the opposing terminals can never be avoided. As a measure to cope with this situation, conductive particles may be added to the resin film 71 as appropriate, in the same manner as depicted for the resin films in FIGS. 6 to 9.

Figure 11A:
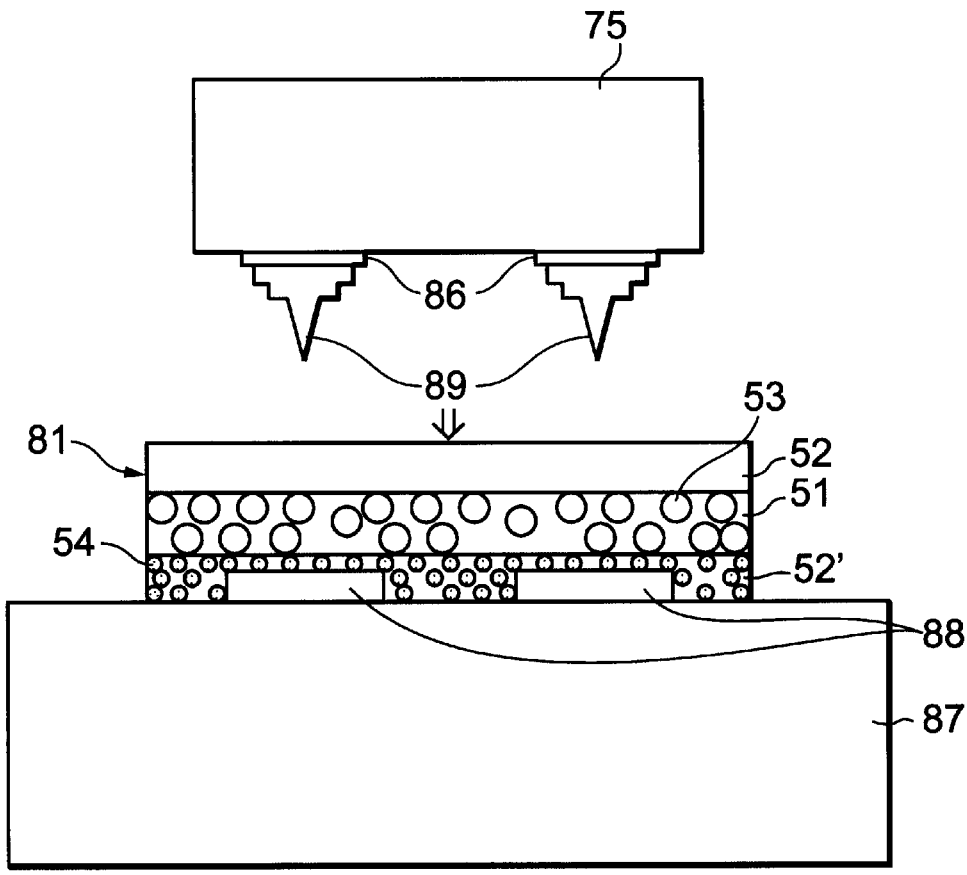
FIGS. 11A and 11B are the cross-sections of a second embodiment of this invention illustrating how an electronic part and a substrate are electrically connected through a resin film of this invention.
Figure 11B:
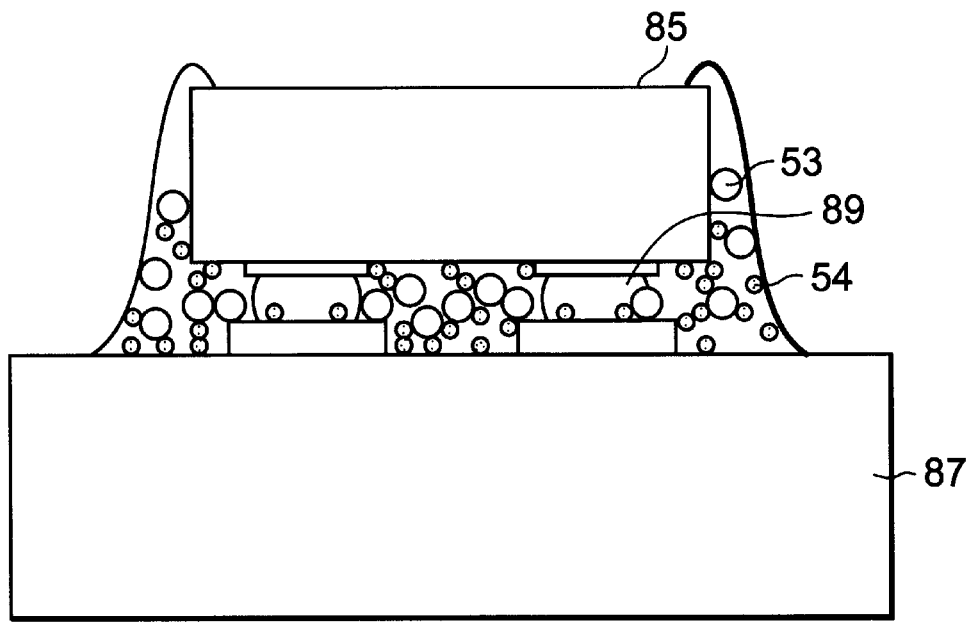

FIGS. 11A and 11B present the cross-sections of electronic parts to illustrate how they are connected through intervention of a resin film, of which one of the electronic parts has pointed bumps and the resin film contains conductive particles. In this example, as shown in FIG. 11A, a resin film 81 is formed over the connection terminal 88 of substrate 87. The resin film 81 is the same with that shown in FIG. 8. A semiconductor chip 85 is put from above on the substrate 87. The semiconductor chip 85 has connection terminals 86 on the surface facing the substrate, and metal bumps 89 on top of those terminals.

When the semiconductor chip has pointed bumps, it is preferred to make conductive particles have a smaller diameter than do insulating inorganic particles 53 contained in the layer 51. This is because, when a semiconductor chip having pointed bumps is pressed against a substrate for connection, particles having a smaller diameter tend to remain in the gap between the opposing terminals during the pressurization process, and thus when conductive particles are allowed to have a smaller diameter than do insulating inorganic particles 53, conductive particles are more preferably allowed to remain in the gap between the opposing terminals. The diameter of conductive particles preferably should have a narrow distribution or variation as is the case with insulating inorganic particles. In concrete terms, conductive particles should have a diameter of not more than 5 μm or more preferably not more than 1 μm.

When insulating inorganic particles whose surface has been coated with a metal are used for conductive particles, they will be effective in reducing the thermal expansion coefficient of resulting film, which is an effect peculiar to insulating inorganic particles. During preparation of such insulating inorganic particles, a resin coat may be intervened between the insulating inorganic particle and metal plate as appropriate, thereby to improve the affinity of inorganic particle to metal plate, and the surface of resin-intervened coat may be corroded with an appropriate chemical. The method for plating a metal is not limited to any specific one, and, for example, non-electrolytic metal plating or vapor deposition may be used. When particles whose resin surface has been coated with a metal layer are used as conductive particles, the resin coat layer of particles interposed between opposing terminals will expand in the presence of heat, and thus the particles will expand in association with the expansion of adjacent resin.

Figure 12A:
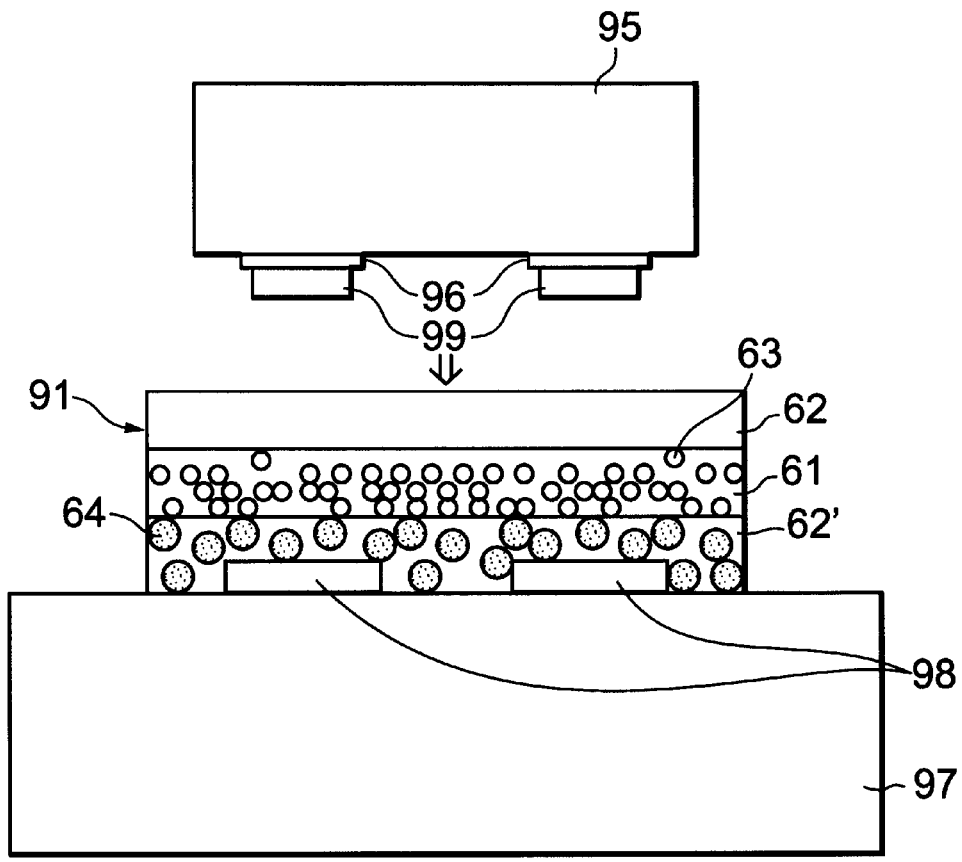
FIGS. 12A and 12B are the cross-sections of a third embodiment of this invention illustrating how an electronic part and a substrate are electrically connected through a resin film of this invention.

Next, the method whereby electronic parts having bumps whose tips have flat surfaces are connected will be described with reference to FIGS. 12A and 12B. The method for preparing a bump 99 of FIG. 12A is not limited to any specific one. For example, pointed bumps are prepared in the manner as described above, and are subjected to a uniform pressure, to have their tips blunted. Or, flat-topped bumps may be plated with a metal.

Contrary to the case shown in FIGS. 10A and 10B where the semiconductor substrate has a terminal with pointed bumps, if in this case a resin film is used which only contains insulating inorganic particles in addition to a base resin, insulating inorganic particles remain in the gap between opposing terminals, thereby interfering with stable electric contact of the involved terminals. To cope with this inconvenience, it is necessary to add conductive particles to a resin layer belonging to layer B. For this embodiment, it is preferred to use such a resin film 91 as shown in FIG. 9. To put it more specifically, conductive particles added to the resin layer 62' of resin film 91 should have a diameter larger than insulating inorganic particles 63 in the resin layer 61.

If conductive particles had a smaller diameter than insulating inorganic particles, and a semiconductor chip 95 were pressed against a substrate, insulating inorganic particles would tend to creep in the gap between the opposing terminals, and thus conductive particles could not contribute to the enhancement of electric connection. If conductive particles had a diameter the same with that of insulating inorganic particles, the involved terminals would have an initial, short-lived electric connection, but could not enjoy a highly reliable contact that would remain stable even under an environment of high temperature or full of thermal shocks. The conductive particles 64 may include various particles prepared in the manner as described above, but what is most preferred includes insulating resin particles whose surface is plated with a metal.

Figure 12B:
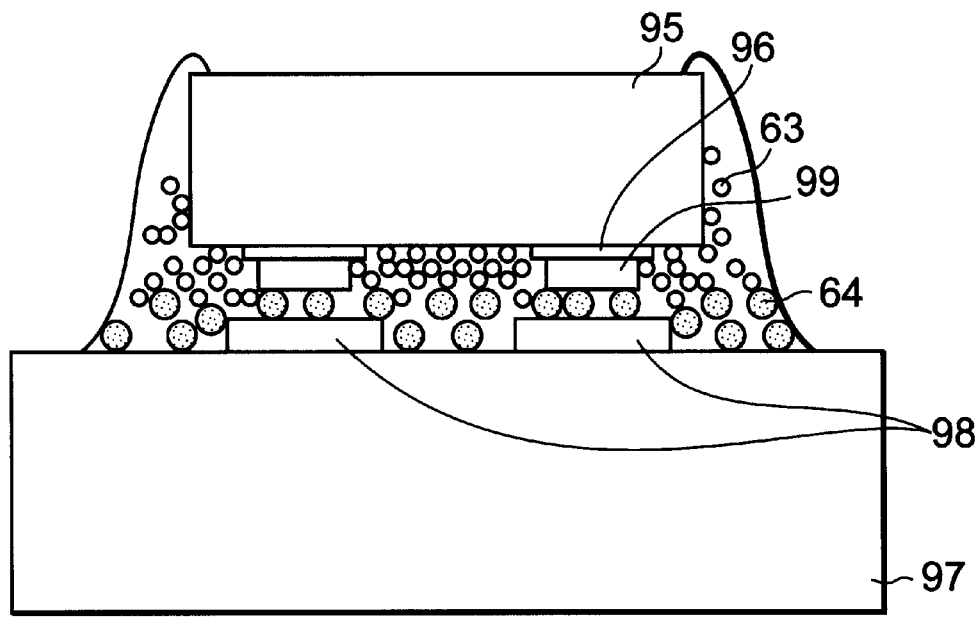

The connection method is essentially the same as used for a semiconductor chip with pointed bumps connected with a substrate stated above (FIGS. 10A and 10B, and FIGS. 11A and 11B), and, as shown in FIG. 12B, the more numerous conductive particles are interposed between the opposing terminals, the more reliable electric connection is ensured.

The above description concerns with a process whereby the resin film is preliminarily pressed against the substrate, but this preliminary contact may be achieved by forming pointed bumps or flat-topped bumps on the substrate and by pressing the resin film against the semiconductor chip.

Figure 13A:
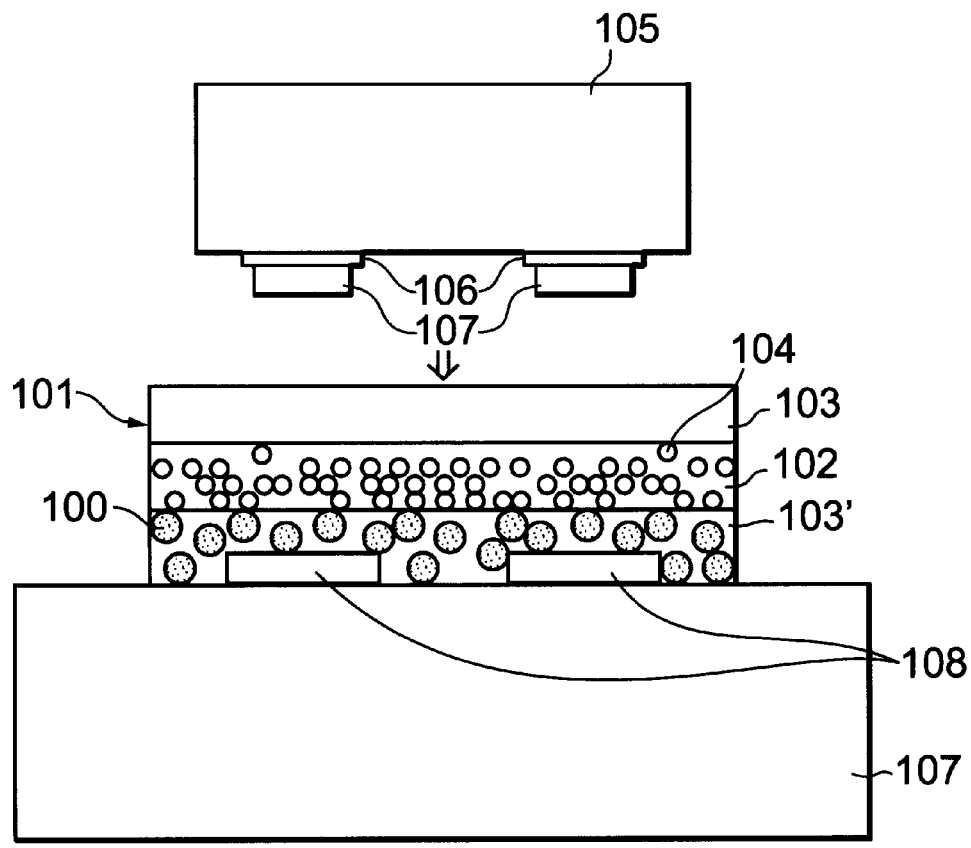
FIGS. 13A and 13B are the cross-sections of a fourth embodiment of this invention illustrating how an electronic part and a substrate are electrically connected through a resin film of this invention.
Figure 13B:
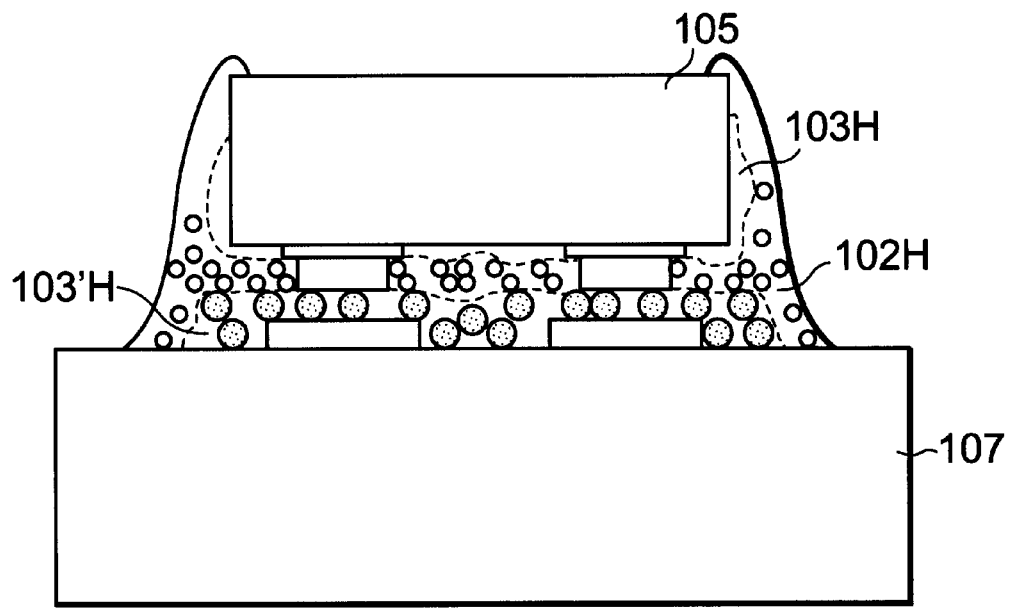

FIGS. 13A and 13B show the cross-sections of electronic parts of a further example to illustrate how they are connected through a resin film of this invention. A semiconductor chip 105 has flat-topped bumps 107 on connection terminals 106. A substrate has electrodes 108, and a resin film 101 is preliminarily laid over the electrodes 108. With regard to the example shown in FIG. 13A, when the resin layer 102 or layer A is made of a thermosetting resin having a relatively low melt viscosity and the resin layer 103 and 103' or layers B are made of a thermoplastic resin having a relatively high melt viscosity, the resulting film will be advantageous because it will allow easy repairing.

This is because, with regard to such a resin film, the resin layer having a lower melt viscosity is more fluidic when pressed in the presence of heat; its excess volume moves more readily; and as a result the layer made of a thermoplastic resin remains beneath the semiconductor chip 105 and on the surface of substrate close to the chip, while the layer made of a thermosetting resin flows to the top and lateral surfaces of chip. As a result, as shown in FIG. 13B, the semiconductor chip 105 and the substrate 107 are essentially connected through solidified layers 103H and 103'H deriving from the resin layers 103 and 103' of a thermoplastic resin, insulating inorganic particles, which otherwise would impair electrical conductivity, being rejected from the contact surfaces, and the volume of thermosetting resin to be removed during repairing being reduced because of its being limited to the surrounds of contact surfaces.

Preferred embodiments of this invention are not limited to what has been described above. For example, in above embodiments, the resin film of this invention is used for connecting, as electronic parts, a semiconductor chip to a substrate by flip-chip connection, but the same may be used for connecting other electronic parts by flip-chip connection.

Further, in above embodiments, one party of the electronic part pair has a bump thereupon as a metal projection, but the connection aid part is not limited to a bump. The other party, to achieve an electric connection with the bump of the opposite party, does not necessarily have a projection on its surface. It may have, for example, a contact surface flush with or lower in height than the bump when the two parties are fitted together.

In above embodiments, as a means to make the elastic modulus of second and third resin layers (B) lower than that of first resin layer (A), insulating inorganic particles are added to the first resin layer. But this may be achieved by adding other substance than insulating inorganic particles.

EXAMPLES

We prepared resin films of this invention and electronic part pairs comprising semiconductor chips and printed wiring board, connected the pairs through the resin films by the connection method described above to use them as examples and comparative examples, and summarized their results in FIGS. 14 and 15. The results represent the evaluation of reliability for each of examples and comparative examples. Typically the resin film consists of a first resin layer (layer A) sandwiched between second and third layers (layer B) and is used for connecting a semiconductor chip to a substrate, and the connection conditions were varied by the shape of bump, the contact temperature and time of a semiconductor chip with a substrate, and the initial contact resistance had been measured. The connection reliability of a given connection was tested by subjecting it to the high temperature (85° C.) & high moisture (85%) endurance test (HHT) which lasted 1000 hours (reliability evaluation 1), and to the cyclically varied temperature endurance test (thirty minutes at −40° C. and 30 minutes at 125° C.) which lasted 500 cycles (reliability evaluation 2).

Example 1

The main composition of layer A included a base resin made from a bisphenol A type epoxy resin (Epicoat 828 provided by Petroleum Chemical Shell Epoxy) and having a thickness of 30 μm which contained, as insulating inorganic particles, 40 wt. % spherical silica whose diameter was 5 to 10 μm. The main composition of layers B included, for both, a cresol novolak type epoxy resin having a thickness of 15 μm. The resin film was preliminarily pressed over the connection terminals of a substrate as shown in FIG. 10A. The bump prepared on the semiconductor chip to be connected with the substrate had a pointed tip. Connection was performed at 200° C. for 15 sec. The initial contact resistance was good or 0.03 (□), and the reliability evaluations 1 and 2 were also good, as shown in FIG. 14.

Example 2

The main composition of layer A included a base resin made from a biphenyl type epoxy resin and having a thickness of 20 μm which contained, as insulating inorganic particles, 55 wt. % spherical silica whose diameter was 7 μm. The main composition of layers B included, for both, a cresol novolak type epoxy resin having a thickness of 20 μm. The resin film was preliminarily pressed over the connection terminals of a substrate as shown in FIG. 10A. The bump prepared on the semiconductor chip to be connected with the substrate had a pointed tip. Connection was performed at 190° C. for 20 sec. The initial contact resistance was good or 0.06 (□), and the reliability evaluations 1 and 2 were also good, as shown in FIG. 14.

Example 3

The main composition of layer A included a base resin made from a bisphenol A type epoxy resin (Epicoat 828) and having a thickness of 30 μm which contained, as insulating inorganic particles, 20 wt. % spherical silica whose diameter was 5 to 10 μm. The main composition of layers B included, for both, a bisphenol A type epoxy resin (Epicoat 1009 provided by Petroleum Chemical Shell Epoxy) having a thickness of 15 μm.

The bisphenol A type epoxy resin (Epicoat 828) constituting the base resin of layer A had a melt viscosity about one tenth or lower than that of the bisphenol A type epoxy resin constituting layer B (Epicoat 1009). The resin film was preliminarily pressed over the connection terminals of a substrate as shown in FIG. 10A. The bump prepared on the semiconductor chip to be connected with the substrate had a pointed tip. Connection was performed at 190° C. for 20 sec. The initial contact resistance was good or 0.06 (□), and the reliability evaluations 1 and 2 were also good, as shown in FIG. 14.

Example 4

The main composition of layer A included a base resin made from a resol type phenol resin and having a thickness of 20 μm which contained, as insulating inorganic particles, 30 wt. % spherical silica whose diameter was 5 μm. The main composition of layers B included, for both, a phenoxy resin having a thickness of 10 μm. The resin film was preliminarily pressed over the connection terminals of a substrate as shown in FIG. 10A. The bump prepared on the semiconductor chip had a pointed tip. Connection was performed at 220° C. for 30 sec. The initial contact resistance was good or 0.1 (□), and the reliability evaluations 1 and 2 were also good, as shown in FIG. 14.

Example 5

The main composition of layer A included a base resin Epicoat 828 made from a bisphenol A type epoxy resin and having a thickness of 30 μm which contained, as insulating inorganic particles, 40 wt. % spherical silica whose diameter was 5 to 10 μm. The main composition of layers B included, for both, a polycarbonate resin having a thickness of 10 μm. The resin film was preliminarily pressed over the connection terminals of a substrate as shown in FIG. 10A. The bump prepared on the semiconductor chip had a pointed tip. Connection was performed at 230° C. for 30 sec. The initial contact resistance was good or 0.15 (□), and the reliability evaluations 1 and 2 were also good, as shown in FIG. 14.

For Examples 1 to 5, the resin film which contained insulating inorganic particles in its layer A as shown in FIG. 4 was used for connection performed by the method as shown in FIGS. 10A and 10B. Further, for Examples 1 to 5, layer A had a lower melt viscosity than did layer B.

Example 6

The main composition of layer A included a base resin made from a naphthalene type epoxy resin and having a thickness of 20 μm which contained, as insulating inorganic particles, 30 wt. % spherical silica whose diameter was 7 μm. The main composition of layers B included, for one half, a cresol novolak type epoxy resin alone having a thickness of 15 μm (layer facing the semiconductor chip), and, for the other half, the same epoxy resin containing 3 volume % conductive particles which resulted from plating gold on spherical silica with a diameter of 2 μm (layer facing the substrate). The conductive particles were prepared so as to have a diameter smaller than that of insulating inorganic particles. The resin film was preliminarily pressed over the connection terminals of the substrate as shown in FIG. 11A. The bump prepared on the semiconductor chip had a pointed tip. Connection was performed at 140° C. for 10 sec, afterwards at 190° C. for 10 sec. The initial contact resistance was good or 0.1 (□), and the reliability evaluations 1 and 2 were also good, as shown in FIG. 14.

Example 7

The main composition of layer A included a base resin made from a bisphenol A type epoxy resin (Epicoat 828) and having a thickness of 30 μm which contained, as insulating inorganic particles, 40 wt. % spherical silica whose diameter was 5 to 10 μm. The main composition of layers B included, for one half, a novolak type epoxy resin alone having a thickness of 20 μm (layer facing the semiconductor chip), and, for the other half, the same epoxy resin containing 5 volume % conductive particles which resulted from plating gold on polystylene particles with a diameter of 5 μm (layer facing the substrate). The conductive particles were prepared so as to have a diameter equal to or less than that of insulating inorganic particles. The resin film was preliminarily pressed over the connection terminals of the substrate as shown in FIG. 11A. The bump prepared on the semiconductor chip had a pointed tip. Connection was performed at 200° C. for 15 sec. The initial contact resistance was good or 0.1 (□), and the reliability evaluations 1 and 2 were also good, as shown in FIG. 14.

For Examples 6 and 7, the bump on the semiconductor substrate had a pointed tip and conductive particles in layer B had a diameter equal to or less than that of insulating inorganic particles of layer A. Through this arrangement it was possible to reject the entry of insulating inorganic particles into the gap between the bump of semiconductor chip and the substrate and to allow only the entry of conductive particles having a smaller diameter into the same gap.

Example 8

The main composition of layer A included a base resin made from a bisphenol A type epoxy resin (Epicoat 828) and having a thickness of 30 μm which contained, as insulating inorganic particles, 30 wt. % spherical boron nitride whose diameter was 1.5 μm. The main composition of layers B included, for one half facing a semiconductor chip, a phenol novolak type epoxy resin alone having a thickness of 15, and, for the other half facing a substrate, the same epoxy resin containing 8 volume % conductive particles which resulted from plating gold on polystyrene particles with a diameter of 5 μm. The conductive particles were prepared so as to have a diameter larger than that of insulating inorganic particles. The resin film was preliminarily pressed over the connection terminals of the substrate as shown in FIG. 12A. The bump prepared on the semiconductor chip had a flattened tip. Connection was performed at 210° C. for 15 sec. The initial contact resistance was good or 0.1 (□), and the reliability evaluations 1 and 2 were also good, as shown in FIG. 14.

Example 9

The main composition of layer A included a base resin made from a dicyclopentadiene type epoxy resin and having a thickness of 20 μm which contained, as insulating inorganic particles, 25 wt. % spherical silica whose diameter was 1 μm. The main composition of layers B included a cresol novolak type epoxy resin having a thickness of 15 μm containing polystylene insulating particles, and one layer B facing a substrate (third resin layer) alone contained, in addition, 7 wt. % nickel conductive particles. The conductive particles were prepared so as to have a diameter larger than that of insulating inorganic particles. The resin film was preliminarily pressed over the connection terminals of the substrate as shown in FIG. 12A. The bump prepared on the semiconductor chip had a flattened tip. Connection was performed at 200° C. for 20 sec. The initial contact resistance was good or 0.08 (□), and the reliability evaluations 1 and 2 were also good, as shown in FIG. 14.

Example 10

The main composition of layer A included a base resin made from a biphenyl type epoxy resin and having a thickness of 30 μm which contained, as insulating inorganic particles, 30 wt. % spherical silica whose diameter was 3 μm. The main composition of layers B included, for both, a cresol novolak type epoxy resin having a thickness of 15, and one layer (facing a substrate) alone contained, in addition, 5 wt. % conductive particles which resulted from plating gold on spherical silica with a diameter of 5 μm. The conductive particles were prepared so as to have a diameter larger than that of insulating inorganic particles. The resin film was preliminarily pressed over the connection terminals of the substrate as shown in FIG. 12A. The bump prepared on the semiconductor chip had a flattened tip. Connection was performed at 210° C. for 20 sec. The initial contact resistance was good or 0.05 (□), and the reliability evaluations 1 and 2 were also good, as shown in FIG. 14.

Example 11

The main composition of layer A included a base resin made from a bisphenol A type epoxy resin (Epicoat 828) and having a thickness of 30 µm which contained, as insulating inorganic particles, 30 wt. % spherical silica whose diameter was 1.5 µm. The main composition of layers B included, for one half facing a semiconductor chip, a butadiene-styrene resin alone having a thickness of 15, and, for the other layer facing a substrate, in addition to above resin, 5 vol. % conductive particles which resulted from plating gold on particles of cross-linked methylmethacrylate with a diameter of 5 µm. The conductive particles were prepared so as to have a diameter larger than that of insulating inorganic particles. The resin film was preliminarily pressed over the connection terminals of the substrate as shown in FIG. 12A. The bump prepared on the semiconductor chip had a flattened tip. Connection was performed at 180° C. for 20 sec. The initial contact resistance was good or 0.1 (□), and the reliability evaluations 1 and 2 were also good, as shown in FIG. 15.

For Examples 8 to 11, the bump on the semiconductor substrate had a flattened tip and conductive particles in layer B had a diameter equal to or larger than that of insulating inorganic particles of layer A as shown in FIGS. 12(a) and 12(b). Through this arrangement it was possible to ensure, even when insulating inorganic particles crept into the gap between the opposing connection terminals, stable connection between the terminals because of similarly interposed conductive particles with a larger diameter than the former.

Next, Comparative examples will be described.

Comparative Example 1

The resin film had a one-layered structure which consisted of a base resin from a naphthalene type epoxy resin having a thickness of 40 µm supplemented, as insulating inorganic particles, with 30 wt. % spherical silica with a diameter of 5 to 10 µm. The resin film was preliminarily pressed over the connection terminals of a substrate. The bump prepared on the semiconductor chip had a pointed tip. Connection was performed at 200° C. for 15 sec. The initial contact resistance was good or 0.02 (□), but, although the reliability ranking 1 being good, reliability ranking 2 was poor as shown in FIG. 15.

Comparative Example 2

The resin film had a one-layered structure which consisted of a base resin from a bisphenol A type epoxy resin (Epicoat 828) having a thickness of 30 µm supplemented, as insulating inorganic particles, with 40 wt. % spherical silica with a diameter of 1 to 10 µm. The resin film was preliminarily pressed over the connection terminals of a substrate. The bump prepared on a semiconductor chip had a pointed tip. Connection was performed at 200° C. for 15 sec. The initial contact resistance was large or 5 (□), and both reliability evaluations 1 and 2 were poor as shown in FIG. 15.

Comparative Example 3

Comparative example 3 is comparable to Example 3. The main composition of layer A included a base resin made from a bisphenol A type epoxy resin (Epicoat 828) and having a thickness of 30 µm which contained, as insulating inorganic particles, 40 wt. % spherical silica whose diameter was 5 to 10 µm. The main composition of layers B included, for both, a bisphenol A type epoxy resin the same with that of layer A (Epicoat 828 and 15 µm in thickness). The resin film was preliminarily pressed over the connection terminals of a substrate as shown in FIG. 10A. The bump prepared on a semiconductor chip had a pointed tip. Connection was performed at 200° C. for 15 sec. The initial contact resistance was good or 0.05 (□), but, although reliability ranking 1 being good, reliability ranking 2 was poor as shown in FIG. 15.

For Comparative example 3, precedence of layer A over layer B in melt viscosity was larger as compared with Example 3, which is undesirable in terms of the affinity of resin to the substrate and semiconductor chip. Although layers A and B consisted of the same base resin, layer A had a substantially larger melt viscosity than did layer B, because the former contained spherical silica.

Comparative Example 4

The main composition of layer A included a base resin made from a biphenyl type epoxy resin and having a thickness of 20 µm which contained 8 wt. % conductive particles which resulted from plating gold on polystylene particles with a diameter of 5 µm. The main composition of layers B included a base resin composed of the same material with that of layer A supplemented with, as insulating inorganic particles, 30 wt. % spherical silica with a diameter of 5 to 10 µm. The resin film was preliminarily pressed over the connection terminals of a substrate as shown in FIG. 10A. The bump prepared on a semiconductor chip had a flattened tip. Connection was performed at 210° C. for 20 sec. The initial contact resistance was comparatively good or 0.1 (□), but both reliability evaluations 1 and 2 were poor as shown in FIG. 15.

For Comparative example 4, because insulating inorganic particles were added to layers B instead of layer A, the elastic modulus of layer A became small as compared with layer B.

Comparative Example 5

Comparative example 5 is comparable to Example 9. The main composition of layer A included a base resin made from a dicyclopentadien type epoxy resin and having a thickness of 20 µm which contained, as conductive particles, 25 wt. % spherical silica with a diameter of 5 to 10 µm. The main composition of layers B included, for both, a base resin made from cresol novolak type epoxy resin, having a thickness of 15 µm and supplemented with, as insulating organic particles, polystylene particles with a diameter of 2 µm, and one half facing a substrate (third resin layer) alone was allowed to contain 7 vol. % nickel conductive particles with a diameter of 3 µm. The resin film was preliminarily pressed over the connection terminals of the substrate as shown in FIG. 12A. The bump prepared on the semiconductor chip had a flattened tip. Connection was performed at 200° C. for 20 sec. The initial contact resistance was too large or 10 (□), and both reliability evaluations 1 and 2 were poor as shown in FIG. 15.

For Comparative example 5, the bump had a flattened tip, and conductive particles had a smaller diameter than did insulating inorganic particles, contrary to the embodiments as illustrated in FIGS. 9 to 12A and 12B. Because of above arrangement, insulating inorganic particles crept into the gap between the opposing connection terminals of bump and substrate, thereby increasing the contact resistance there. Further, because insulating inorganic particles became large, the affinity resin to electronic parts was also impaired.

What is claimed is:

1. A resin film used for connecting electronic parts through flip-chip connection or controlled-collapse bonding wherein:

a first insulating resin layer (A) is sandwiched between second and third resin layers (B) to give a laminated B/A/B structure; and the elastic modulus of the second and third resin layers (B) is smaller than that of the first insulating resin layer (A).

2. A resin film as described in claim 1 wherein the first insulating resin layer (A) contains insulating inorganic particles in its base resin, and the second and third resin layers (B) do not contain any insulating inorganic particles in their base resins.

3. A resin film as described in claim 1 wherein the base resin of the first insulating resin layer (A) has a smaller melt viscosity than do those of the second and third resin layers (B).

4. A resin film as described in claim 2 wherein the insulating inorganic particles contained in the first insulating resin layer (A) are spherical silica.

5. A resin film as described in claim 1 wherein at least one of the base resins constituting the second and third base layers (B) contains conductive particles.

6. A resin film as described in claim 1 wherein the first insulating resin layer (A) contains insulating inorganic particles in its base resin, and the second and third resin layers (B) contain insulating organic particles in their base resins.

7. A resin film used for connecting (controlled-collapse bonding) electronic parts through flip-chip connection or controlled-collapse bonding wherein:

a first resin layer (A) is sandwiched between second and third resin layers (B) to give a laminated B/A/B structure;

the first resin layer (A) contains insulating inorganic particles in its base resin; and at least one of the second and third resin layers (B) contains conductive particles in its base resin.

8. A resin film as described in claim 7 wherein the diameter of insulating inorganic particles contained in the first resin layer (A) and the diameter of conductive particles contained in at least one of the second and third resin layers (B) are varied in accordance with the connection structure of the electronic parts to be connected.

9. A resin film used for connecting electronic parts through flip-chip connection or controlled-collapse bonding by pressing them together for close contact with at least a pointed metal projection intervened wherein:

a first resin layer (A) is sandwiched between second and third resin layers (B) to give a laminated B/A/B structure;

the first resin layer (A) contains insulating inorganic particles in its base resin, and at least one of the second and third resin layers (B) contains conductive particles in its base resin; and the diameter of conductive particles contained in at least one of the second and third resin layers (B) is smaller than that of insulating inorganic particles contained in the base resin of first resin layer (A).

10. A resin film used for connecting electronic parts through flip-chip connection or controlled-collapse bonding by pressing them together for close contact with at least a flattened metal projection intervened wherein:

a first resin layer (A) is sandwiched between second and third resin layers (B) to give a laminated B/A/B structure;

the first resin layer (A) contains insulating inorganic particles in its base resin, and at least one of the second and third resin layers (B) contains conductive particles in its base resin; and the diameter of conductive particles contained in at least one of the second and third resin layers (B) is bigger than that of insulating inorganic particles contained in the base resin of first resin layer (A).

11. A resin film as described in claim 1 wherein the first insulating resin layer and the second and the third resin layers or layer A and layers B are made of thermosetting resins.

12. A resin film as described in claim 1 wherein the first insulating resin layer (A) is made from a thermosetting resin and the second and third resin layers (B) are made of thermoplastic resins.

13. A resin film as described in claim 5 wherein the conductive particles contained in the second or third resin layer (B) comprise particles which are obtained by coating the surface of insulating particles with a metal film.

* * * * *